US008912881B2

(12) United States Patent
Tjebben

(10) Patent No.: US 8,912,881 B2
(45) Date of Patent: Dec. 16, 2014

(54) METHODS AND APPARATUS FOR DYNAMICALLY AUTHENTICATED IDENTIFICATION

(75) Inventor: Michael O. Tjebben, Cary, NC (US)

(73) Assignee: Cisco Technology, Inc, San Jose, CA (US)

( * ) Notice: Subject to any disclaimer, the term of this patent is extended or adjusted under 35 U.S.C. 154(b) by 2309 days.

(21) Appl. No.: 11/765,660

(22) Filed: Jun. 20, 2007

(65) Prior Publication Data
US 2008/0252456 A1     Oct. 16, 2008

(51) Int. Cl.
*G06F 7/04*        (2006.01)
*H01L 21/768*      (2006.01)
*H01L 23/522*      (2006.01)
*H01L 27/02*       (2006.01)
*H01L 27/105*      (2006.01)
*H01L 21/74*       (2006.01)
*H01L 21/3213*     (2006.01)

(52) U.S. Cl.
CPC ........ *H01L 21/76838* (2013.01); *H01L 23/522* (2013.01); *H01L 27/0203* (2013.01); *H01L 27/105* (2013.01); *H01L 21/743* (2013.01); *Y10S 438/942* (2013.01); *H01L 21/32139* (2013.01)
USPC ............................. 340/5.2; 235/380; 438/942

(58) Field of Classification Search
USPC ........................................................ 340/5.2
See application file for complete search history.

(56) References Cited

U.S. PATENT DOCUMENTS

| 6,032,024 A * | 2/2000 | Makino ........................ 340/7.56 |
| 7,176,849 B1 * | 2/2007 | Mooney et al. ................ 345/2.3 |
| 7,233,250 B2 | 6/2007 | Forster |
| 7,636,029 B1 * | 12/2009 | Zhou et al. ..................... 340/5.2 |
| 2006/0055552 A1 | 3/2006 | Chung et al. |
| 2007/0117623 A1 | 5/2007 | Nelson et al. |
| 2007/0240198 A1 | 10/2007 | Kander et al. |

* cited by examiner

*Primary Examiner* — Omer S Khan
*Assistant Examiner* — Sara Samson
(74) *Attorney, Agent, or Firm* — P. Su

(57) ABSTRACT

Methods and apparatus for visually authenticating an entity which displays a radio frequency identification (RFID) tag are disclosed. In one embodiment, an apparatus includes a locator that determines when a radio frequency (RF) receiver is present within a vicinity. The apparatus also includes a server configured to identify a security element and configured to obtain an information element associated with the RF receiver when the RF receiver is present within the vicinity, as well as a transmitter. The transmitter transmits a first representation of the security element to a display arrangement, a second representation of the security element to the RF receiver, and the information element to the RF receiver. The second representation of the security element is arranged to overlay the information element when the second representation of the security element and the information element are displayed.

31 Claims, 7 Drawing Sheets

METHODS AND APPARATUS FOR DYNAMICALLY AUTHENTICATED IDENTIFICATION

BACKGROUND OF THE INVENTION

Personnel associated with venues are often identified using identification (ID) tags or badges. For example, employees of a particular enterprise may have ID tags or badges that identify them as being a part of the particular enterprise and, therefore, entitled to enter buildings or entitled to use of resources associated with the particular enterprise. In general, there is a relatively high level of trust projected onto those who display an ID tag or badge associated with an enterprise, as someone who displays the ID tag or badges will typically be assumed to be a member of the enterprise. Unfortunately, as ID tags, even those equipped with photographs and/or electronic or other mechanisms, are not difficult to forge or counterfeit, the relatively high level of trust projected onto those wearing ID tags is often misguided.

BRIEF DESCRIPTION OF THE DRAWINGS

The invention may best be understood by reference to the following description taken in conjunction with the accompanying drawings in which.

DESCRIPTION OF EXAMPLE EMBODIMENTS

General Overview

Figure 1A:
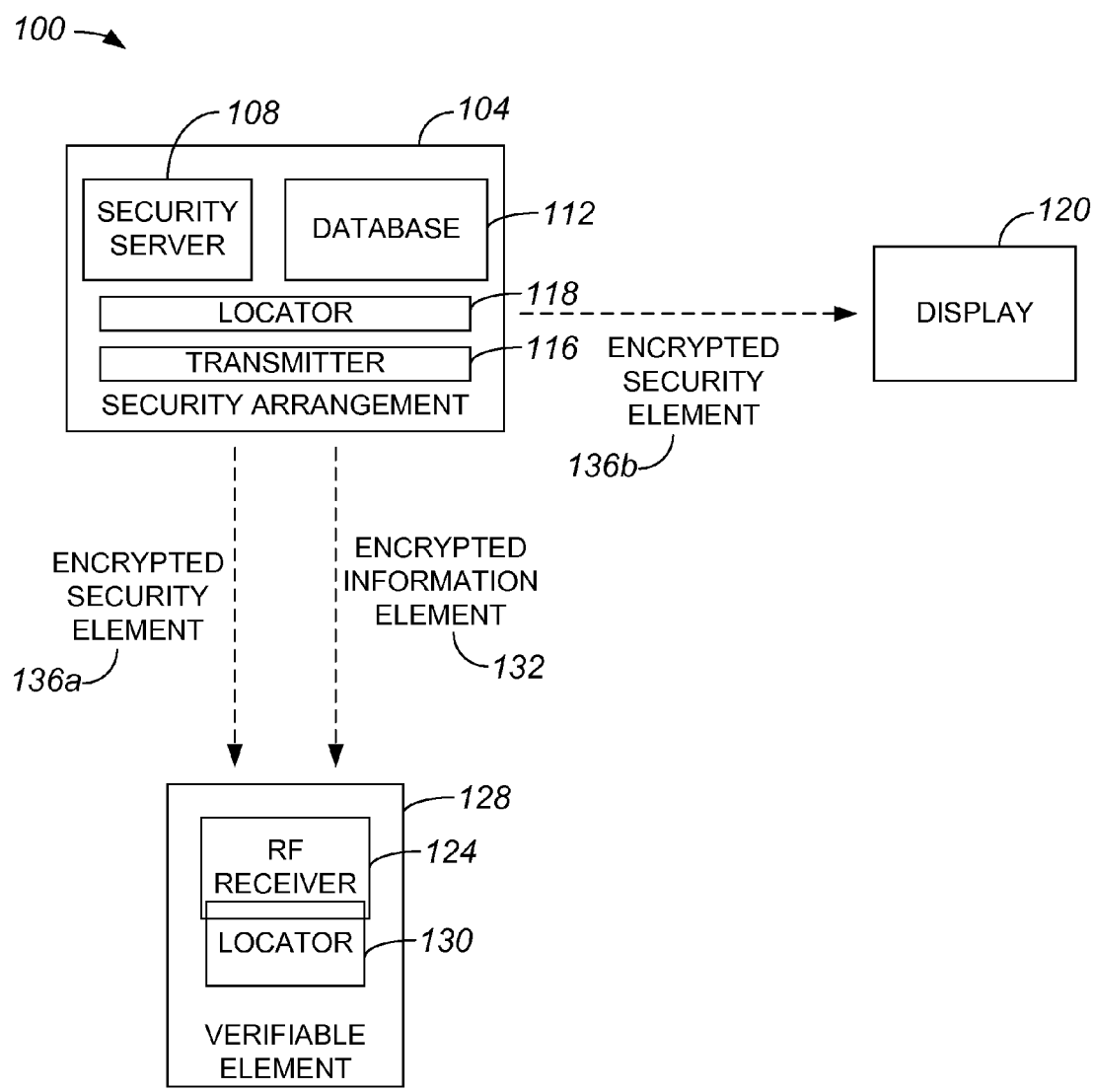
FIG. 1A is a diagrammatic representation of an overall system which implements dynamically authenticated visual identification in accordance with an embodiment of the present invention.

In one embodiment, an apparatus includes a locator that determines when a radio frequency (RF) receiver is present within a vicinity. The apparatus also includes a server configured to identify a security element and configured to obtain an information element associated with the RF receiver when the RF receiver is present within the vicinity, as well as a transmitter. The transmitter transmits a first representation of the security element to a display arrangement, a second representation of the security element to the RF receiver, and the information element to the RF receiver. The second representation of the security element is arranged to overlay the information element when the second representation of the security element and the information element are displayed.

DESCRIPTION

Many venues in which identification tags are used to identify appropriate personnel, i.e., personnel affiliated with or otherwise trusted by the venue, utilize monitors or displays that are prominently displayed. Prominently displayed electronic displays may display information that is pertinent to the venue. Such information may include, for example, instant replays associated with a sporting event staged at the venue or the score of a sporting event staged at the venue. The displays are generally arranged such that persons at the venue are readily able to view the displays.

Providing a security indicator that enables persons or patrons at a venue to ascertain whether identification tags, e.g., radio frequency identification (RFID) tags on which the photographs of personnel are displayed, worn by personnel at the venue are valid provides the persons with a sense of security if they are interacting with the personnel. Knowing that a security guard, for instance, is actually a security guard and not an imposter enables a person to safely place his or her trust into the security guard. A security indicator may be an indicator which may be compared to an associated indicator on the RFID tags worn by trusted personnel such that an individual may be able to determine if the RFID tag is indeed valid.

As there may be multitudes of people at a venue such as a stadium, providing a security indicator directly to each person is impractical. Using electronic displays that are prominently displayed at a venue to exhibit a security indicator, however, allows each individual at the venue to view the security indicator and to obtain knowledge regarding the security indicator. Further, an individual may have a display on which the security indicator is exhibited within view while trying to determine if a particular RFID tag is valid. In one embodiment, a security indicator that is displayed on a display may be an "alteration characteristic" such as a color, and the RFID tags of trusted personnel may include an overlay of the same color such that individuals, upon comparing the displayed security indicator with the RFID tags, may determine if the RFID tags are valid.

Although RFID tags may be forged, a forger will not be aware of the security indicator that is associated with a particular venue. Hence, a forged RFID tag generally will not include the security indicator. As such, individuals at the venue will be able to identify forged RFID tags and, hence, unauthorized personnel, by determining if the security indicator is consistent with what is displayed on the RFID tags. Personnel may be identified as being unauthorized or unauthenticated if they have RFID tags that are inconsistent with the security indicator exhibited on the display of a venue. By way of example, if a security indicator exhibited on a display shows a green color pattern and an RFID tag is not overlaid with the green color pattern, the RFID tag may be assumed to be unauthenticated and the person in possession of the RFID tag may be assumed to be an imposter.

FIG. 1A is a diagrammatic representation of an overall system which implements dynamically authenticated visual identification in accordance with an embodiment of the present invention. A system 100 includes a security arrangement 104, a display 120, and a verifiable element 128. Security arrangement 104 may generally be located within a venue in which verifiable element 128 is to be dynamically authenticated, although it should be appreciated that security arrangement 104 may instead be remote to the venue, but accessible by a computing element associated with the venue. In one embodiment, security arrangement 104 may be a distributed system in which some functionality associated with security arrangement 104 is local to the venue, while other functionality may be remote to the venue by accessible via a network.

Security arrangement 104 is arranged to store security indicators and other information that may be used to authenticate verifiable element 128, and is arranged to effectively implement the security indicators on display 120 and on verifiable element 128. A security server 108 that is a part of security arrangement 104 includes logic, e.g., hardware and/or executable software logic embodied on a tangible media, that, when executed, allows a security measure to be implemented. By way of example, security server 108 may determine which security indicator to implement on verifiable element 128 and to display on display 120. Security server 108 is also typically configured to encrypt data for transmission.

Various potential security indicators, as well as information relating to legitimate personnel, may be stored in a database 112 of security arrangement 104. Such information may include, but is not limited to including, digital photographs or legitimate personnel who are affiliated with the venue. In one embodiment, database 112 may be an employee database in which information pertaining to employees of an enterprise, or employees of the venue, is generally stored. Security arrangement 116 also includes a transmitter 116 that is arranged to transmit security elements 136a, 136b and an information element 132. In general, security elements 136a, 136 and information element 132 may be encrypted by security server 108 prior to being transmitted by transmitter 116. It should be appreciated that while transmitter 116 may typically be arranged to transmit data on wireless channels or RF channels, transmitter 116 may also transmit data across wired communications channels or links.

Security arrangement 104 also includes a locator 118 which is arranged to sense when verifiable element 128 is present at a venue, or is present within a vicinity, e.g., a predefined zone. Locator 118 may be substantially any location sensing device that may determine whether verifiable element 128 is present at a venue, such as a global positioning system (GPS) receiver.

Verifiable element 128 includes a locator tag 130, which allows locator 118 to sense verifiable element 128, and a receiver 124 which is arranged to receive data. In the described embodiment, receiver 124 is an RF receiver associated with an RFID tag or badge. When verifiable element 128, which may be an individual, object, or device that is to be authenticated, is sensed by locator 118, security arrangement 104 transmits encrypted security element 136a and encrypted information element 132 to verifiable element 128. Encrypted information element 132 may be an encrypted version of a photograph associated with verifiable element 128, e.g., a photograph of an individual. Upon receiving encrypted security element 136a and encrypted information element 132, receiver 124 may decrypt and display information element 132 and security element 136a. While encrypted security element 136a and encrypted information element 132 are shown as being transmitted as substantially separate streams, it should be appreciated that encrypted security element 136a and encrypted information element 132 may effectively be combined and transmitted as a substantially single stream.

In addition to transmitting encrypted security element 136a to verifiable element 128, encrypted security element 136b is transmitted to display 120. It should be understood that security elements 136a, 136b may be substantially the same, but may offset to provide additional security, as will be discussed below with respect to FIG. 3.

Figure 1B:
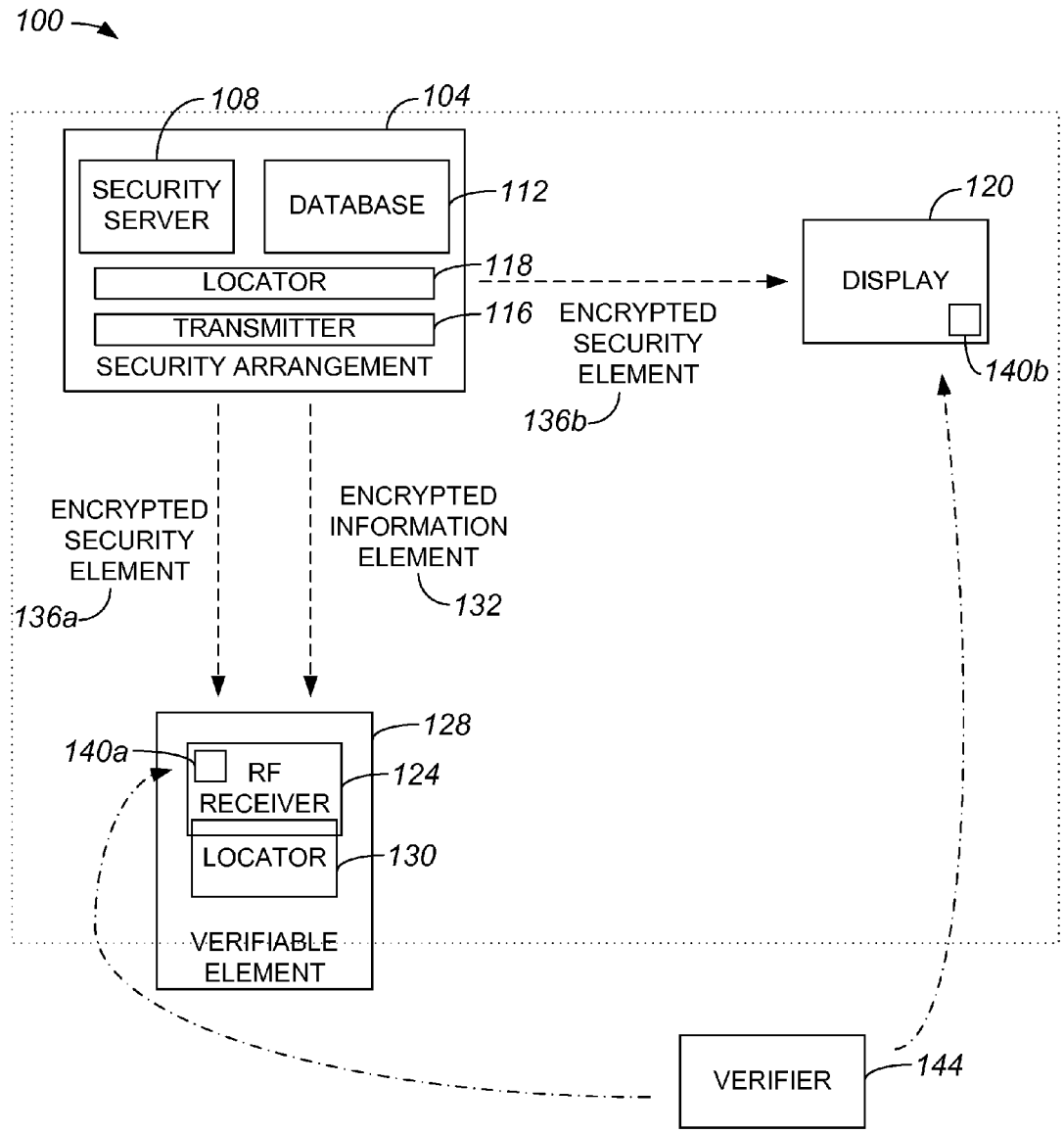
FIG. 1B is a diagrammatic representation of an overall system, e.g., system 100 of FIG. 1A, in which a verifier engages in visual authentication in accordance with an embodiment of the present invention.

A verifier, or an individual who is attempting to dynamically authenticate verifiable element 128, may compare security element 136b, as displayed on display 120, with security element 136a, as displayed by receiver 124. FIG. 1B is a diagrammatic representation of system 100 in which a verifier engages in visual authentication in accordance with an embodiment of the present invention. A verifier or observer 144 may visually compare a manifestation 140a of information element 132 and security element 136a with a manifestation 140b of security element 136b to authenticate verifiable element 128. That is, verifier 144 may determine if information element 132 is consistent with verifiable element 128 and if security element 136a is consistent with security element 136b. By way of example, if information element 132 is a photograph and verifiable element 128 is a person, verifier 144 may determine if information element 132 is a photograph of the person. If security element 136a is a particular color, verifier 144 may ascertain whether the particular color is shown in manifestation 140b. If the color and the photograph are verified, then verifiable element 128 is dynamically authenticated.

Figure 2:
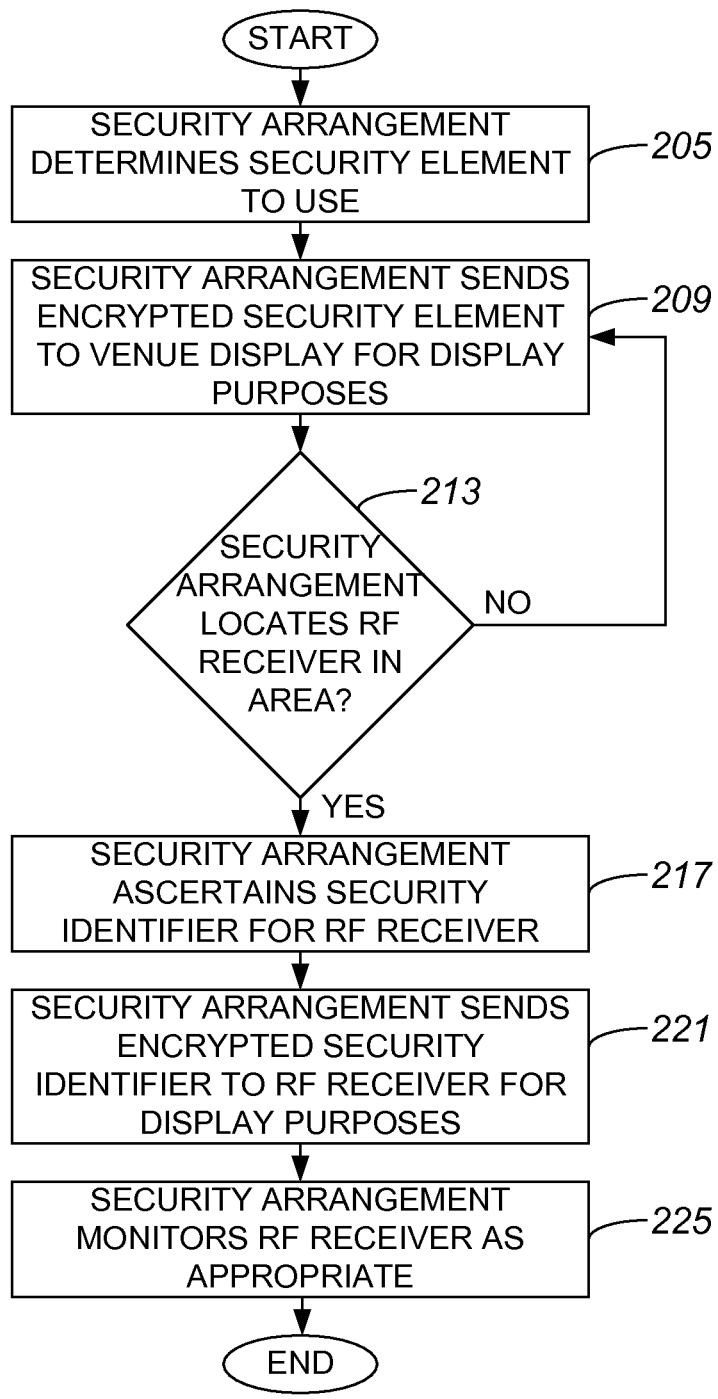
FIG. 2 is a process flow diagram which illustrates one method of operating a security arrangement of an overall system which implements dynamically authenticated visual identification in accordance with an embodiment of the present invention.

With reference to FIG. 2, one method of operating a security arrangement of an overall system which implements dynamically authenticated visual identification will be described in accordance with an embodiment of the present invention. A process 201 of operating a security arrangement begins at step 205 in which a security arrangement determines a security element to be used. The security element, or indicator, may be any combination of a pattern, a color, or an icon that is to be used to authenticate personnel at a venue. In one embodiment, the security element may be a relatively randomized scrolling color pattern, or a scrolling set of icons. Once the security element is determines the security element to use, the security arrangement encrypts the security element for transmission, and transmits the encrypted security element to a venue display for display purposes in step 209. The transmission may be through wireless communication channels or wired communication links, or a combination of both.

In step 213, the security arrangement determines if an RF receiver such as an RFID tag is located within an area or vicinity, e.g., an area or vicinity defined around the security arrangement. Such a determination may be made using locators or detection sensors that effectively sense when an RF receiver has entered into a range that is sensed by the locators or detection sensors. If it is determined that an RF receiver has not been located in the area, process flow returns to step 209 in which the security arrangement sends or transmits the encrypted security element to the venue display for display purposes.

Alternatively, if the determination in step 213 is that an RF receiver has been located in the area, the security arrangement ascertains the appropriate security identifier to send to the RF receiver in step 217. Ascertaining the appropriate security identifier may include determining a security identifier that corresponds to the security element sent to the venue display. In one embodiment, ascertaining the appropriate security identifier may further include determining a delay or offset to use in transmitting information to the RF receiver. The use of an offset provides an additional layer of security, as will be discussed below with respect to FIG. 3. After the security identifier for the RF receiver is ascertained, the security arrangement encrypts the security identifier, and sends the encrypted security identifier to the RF receiver in step 221 for display purposes. Typically, the encrypted security identifier is transmitted on an RF channel.

Once the security arrangement transmits the encrypted security identifier to the RF receiver, the security arrangement monitors the RF receiver as appropriate in step 225. Monitoring the RF receiver may include, but is not limited to including, determining when the RF receiver is no longer in the area. The process of operating a security arrangement is completed after the security arrangement monitors the RF receiver as appropriate.

In one embodiment, in order to provide a higher level of security, the security indicators displayed on an RFID tag and on a display may be substantially the same, but offset. That is, an ordered series of security indicator components may be provided such that the ordered series is displayed starting at a time t0 on an RFID tag and starting at a time t1 on a venue display. By way of example, the color of a security indicator displayed on an RFID tag may be arranged to change from a first color to a second color slightly before the color of a security indicator displayed on a venue display changes from the first color to the second color. Enabling the color to change substantially asynchronously such that the color on the RFID tag may change slightly before that of the venue display makes it more difficult for a potential forger to forge an RFID tag, thereby increasing the level of security. Having the change occur first to an RFID tag, followed by a change to a venue display effectively makes it impossible for a counterfeiter to successfully create a system to examine the venue display from a remote location, extract the security indicator, and apply the same indicator to a counterfeit RFID tag, because the ordering of asynchronous changes applied will be different between that of the counterfeit and legitimate tags.

Figure 3:
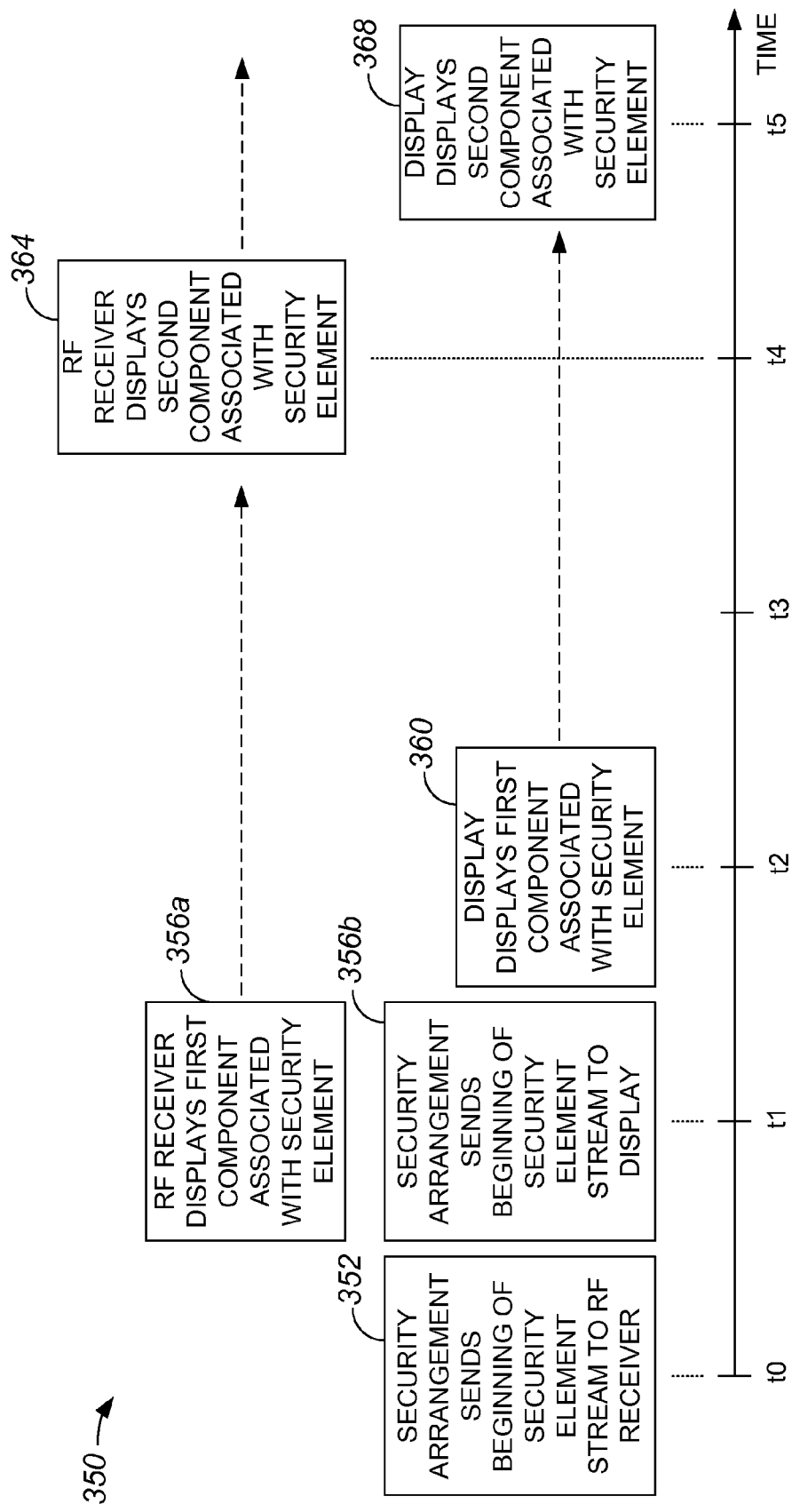
FIG. 3 is a diagrammatic representation of a timeline associated with an asynchronous authentication process in accordance with an embodiment of the present invention.

Referring next to FIG. 3, displaying security elements or indicators used as a part of an asynchronous authentication process will be described in accordance with an embodiment of the present invention. A timeline 350 indicates steps associated with displaying security elements. At a time t0, step 352 occurs in which a security arrangement sends the beginning of a security element stream to an RF receiver such as an RFID tag. It should be appreciated that the security element stream is generally encoded, and is arranged to be decoded by the RF receiver. At a time t1, step 356a occurs in which the RF receiver displays the first component associated with the security element. By way of example, if the first component is the color green, the RF receiver may display the color green as an overlay for a displayed photograph on the RF receiver.

Also at time t1, step 356b occurs in which the security arrangement sends the beginning of the security element stream to a venue display. At a time t2, step 360 occurs in which the venue display displays the first component associated with the security element. Hence, if the first component is the color green, the venue display may display the color green in a corner of the venue display. The RF receiver is also displaying the first component of the security element at time t2.

At a time t3, both the venue display and the RF receiver display the first component of the security element. However, at a time t4, while the venue display continues to display the first component associated with the security element, step 364 occurs in which the RF receiver displays the second component associated with the security element. By way of example, if the second component is the color red, then at time t4, the RF receiver switches from displaying the color green to the color red. While the RF receiver continues to display the second component associated with the security element at a time t5, step 368 occurs at time t5 such that the venue display begins to display the second component associated with the security element.

Figure 4A:
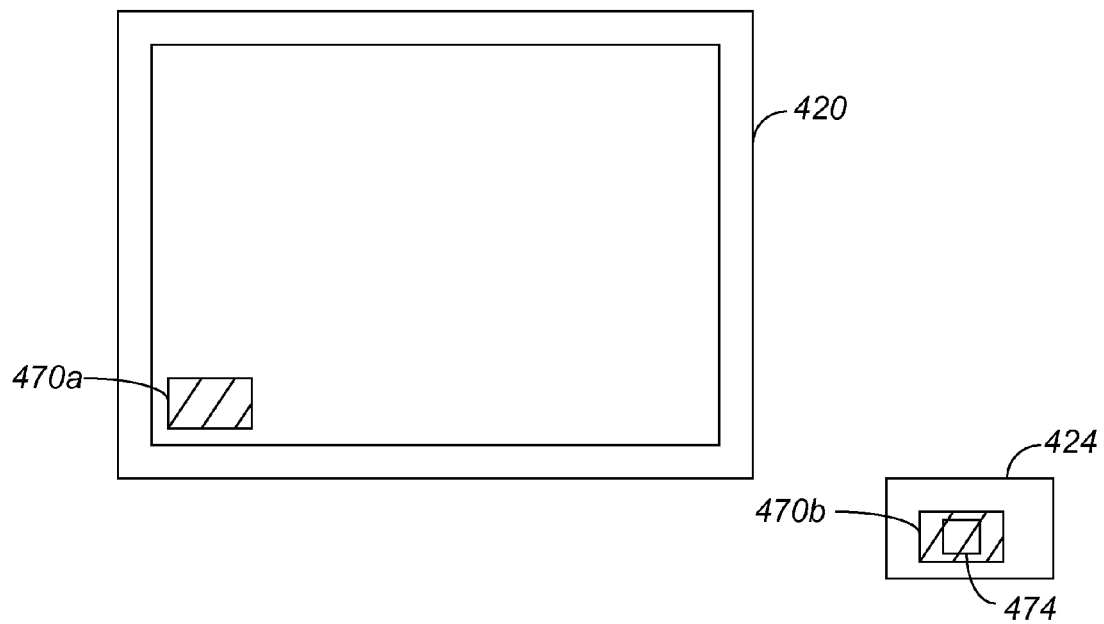
FIG. 4A is a diagrammatic representation of a color-based and/or pattern-based correlation between a display and a radio frequency identification (RFID) tag with display capabilities in accordance with an embodiment of the present invention.

As previously mentioned, the security elements may be widely varied. For example, the security elements may be colors or icons. FIG. 4A is a diagrammatic representation of a color-based and/or pattern-based correlation between a display and a RFID tag with display capabilities in accordance with an embodiment of the present invention. A display screen 420, e.g., a display screen at a venue, may be arranged to display a security element or indicator 470a. Security element 470a may be a color or a pattern. In the described embodiment, security element 470a may change or be otherwise updated periodically. An RFID tag 424 includes a pictorial element 474, which may be a display of a photograph of an individual who is associated with RFID tag 424. As shown, security element 470b is displayed such that security element 470b overlays pictorial element 474. However, it should be appreciated that security element 470b may be displayed such that security element 470b does not overlay pictorial element 474. That is, if security element 470b is a color, pictorial element 474 may not necessarily be displayed in a hues corresponding to the color. Instead, security element 470b may be displayed substantially adjacent to pictorial element 474.

Figure 4B:
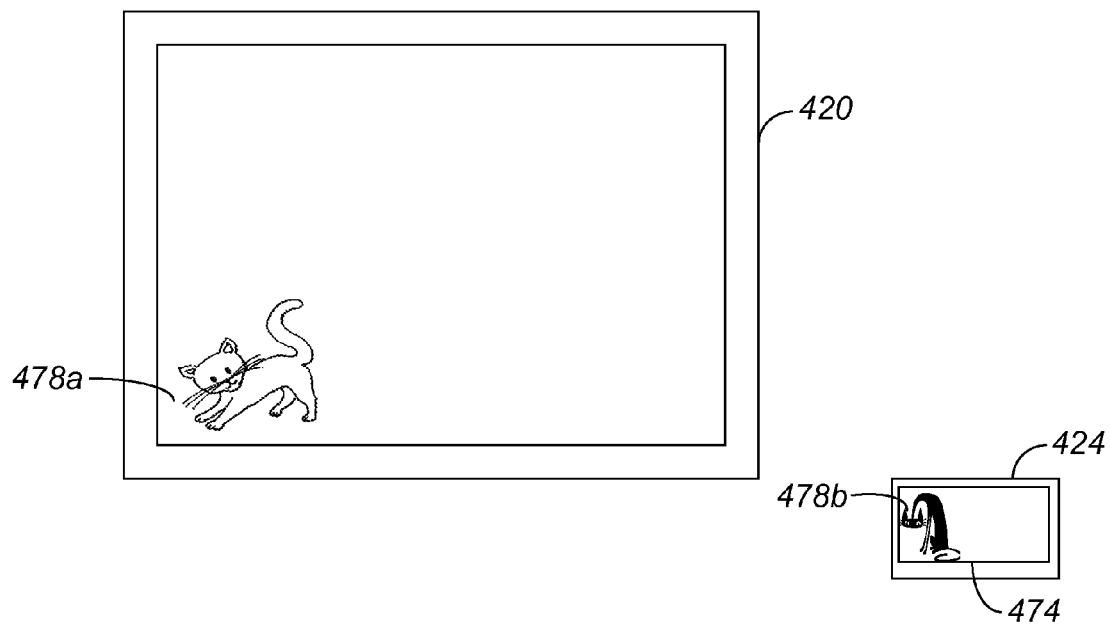
FIG. 4B is a diagrammatic representation of an icon-based correlation between a display and a RFID tag with display capabilities in accordance with an embodiment of the present invention.

Icons may be used as security elements. The same icon may be displayed on both a display screen and an RFID tag. Alternatively, one icon may be displayed on a display screen, and an icon from the same family may be displayed on the RFID tag such that there is effectively an icon-based correlation between the display and the RFID tag. FIG. 4B is a diagrammatic representation of an icon-based correlation between a display and a RFID tag with display capabilities in accordance with an embodiment of the present invention. A display screen 420, e.g., a display screen at a venue, may be arranged to display an icon 478a that represents a security element. Icon 478a, in the described embodiment, may be a photograph of a cat. An RFID tag 424 includes a pictorial element 474, which may be a display of a photograph of an individual who is associated with RFID tag 424. As shown, RFID tag 424 displays an icon 478b that represents a security element. Icon 478b may be a drawn or cartoon version of a cat, i.e., an icon that correlates with icon 478b. Hence, a verifier may verity RFID tag 424 as being legitimate if icon 478a and icon 478b are correlated.

Security elements may be displayed in a scroll-based or changing manner such that the security elements displayed on a display screen and on an RFID tag may change. Allowing the security elements that are displayed to scroll generally reduces the likelihood that RFID tags may be forged, as it is typically difficult for a forger to anticipate changes in the security elements. Hence, even in the unlikely even that a forger manages to identify a current security element as being a particular color or pattern and creates a forged RFID tag based on that particular color or pattern, by the time the forged RFID tag is in use, the color or pattern associated with the security element may have changed, and therefore rendered the forged RFID tag useless. The computational complexity of automatically examining a venue display or RFID tag that is displaying a changing overlay pattern, color, or icon, and applying that same change to a counterfeit RFID tag, substantially in real time, and in a particular temporal sequence, effectively renders this means of counterfeit impractical. In general, the more complex the changing item, the more difficult it is to extract the changing item in extract real-time and to re-apply the changing item to a counterfeit RFID tag.

Figure 5A:
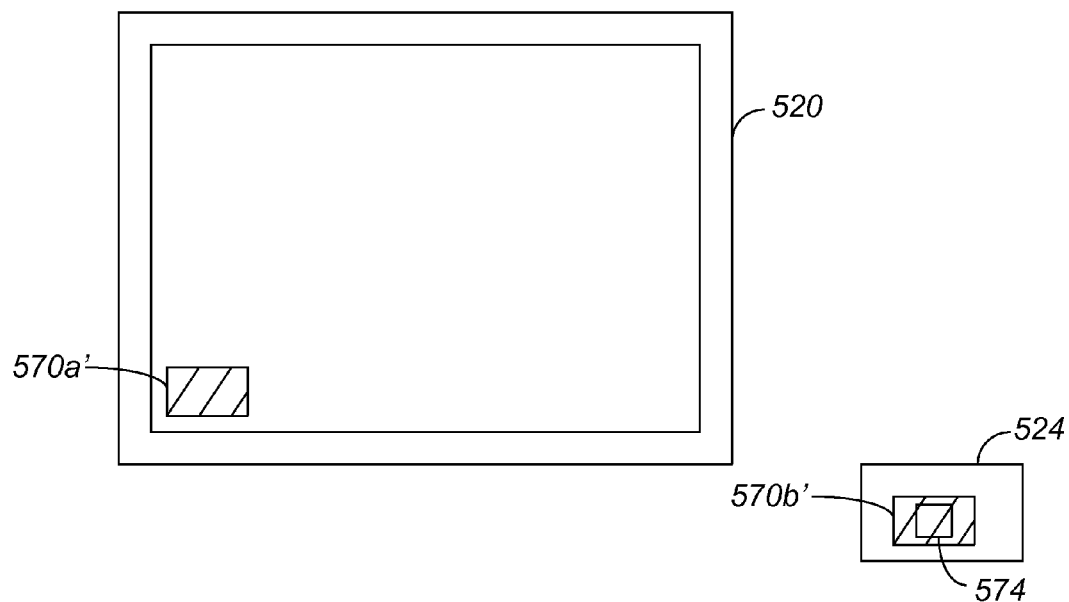
FIG. 5A is a diagrammatic representation of an asynchronous or scroll-based correlation between a display and a RFID tag with display capabilities at a first time in accordance with an embodiment of the present invention.
Figure 5B:
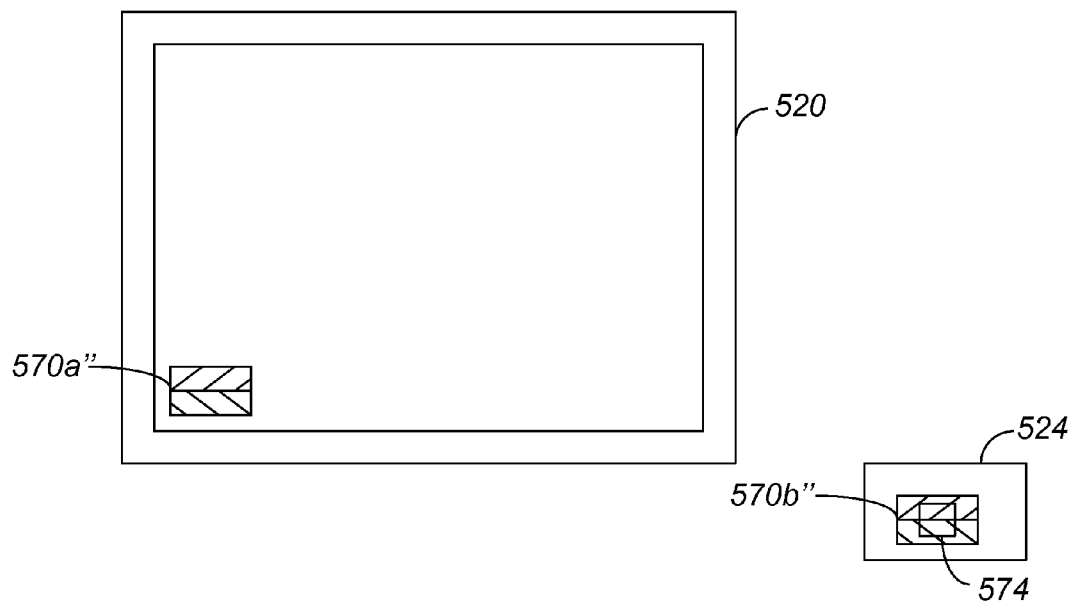
FIG. 5B is a diagrammatic representation of an asynchronous or scroll-based correlation between a display and a RFID tag with display capabilities at a second time in accordance with an embodiment of the present invention.
Figure 5C:
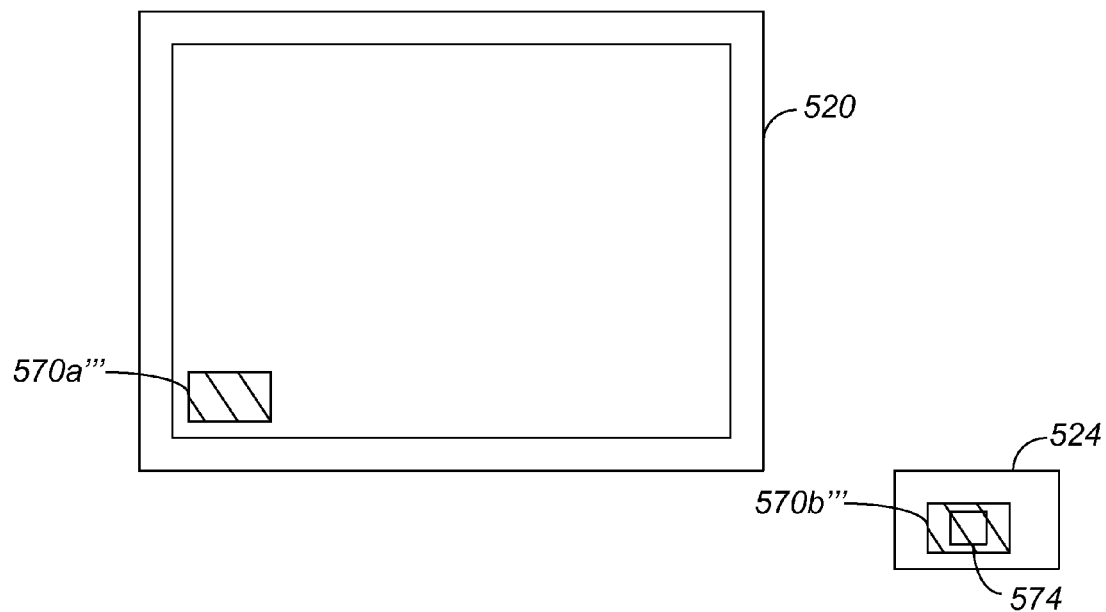
FIG. 5C is a diagrammatic representation of an asynchronous or scroll-based correlation between a display and a RFID tag with display capabilities at a third time in accordance with an embodiment of the present invention.

With reference to FIGS. 5A-5C, scrolling security elements will be described in accordance with an embodiment of the present invention. FIG. 5A is a diagrammatic representation of an asynchronous or scroll-based correlation between a display and a RFID tag with display capabilities at a time t0 in accordance with an embodiment of the present invention. A display screen 520, e.g., a display screen at a venue, may be arranged to display a security element or indicator 570a'. Security element 570a' may be a first color or a pattern. An RFID tag 524 includes a pictorial element 574, such as a digitally generated photograph of an individual who is associated with RFID tag 524. A security element 570b', which is the same color or pattern as security element 570a', is displayed over pictorial element 574 at time t0.

At a time t1, as shown in FIG. 5B, security element 570a" is transitioning or scrolling from the first color or pattern to a second color or pattern. Similarly, security element 570b" is also transitioning from the first color or pattern to the second color or pattern. At a time t2, as shown in FIG. 5C, security element 570a'" has effectively transitioned to the second color or pattern, as has security element 570b'".

Although only a few embodiments of the present invention have been described, it should be understood that the present invention may be embodied in many other specific forms without departing from the spirit or the scope of the present invention. By way of example, while the present invention has been described in terms of displays and RFID tags associated with a stadium or an arena, a dynamically authenticated visual identification scheme may generally be implemented in any suitable venue or space that includes displays. That is, the present invention is not limited to use in stadium or arena environments. For instance, many shopping malls include prominent displays which display advertisements, and many conference venues include prominent displays which display conference schedules. Such displays may be used in conjunction with RFID badges worn by security or other personnel affiliated with the malls or venues to allow for dynamic visual identification using the methods of the present invention.

The use of dynamic authentication is not limited to being associated with RFID badges or tags. By way of example, dynamic authentication may be used to verify devices such as those which require credit cards or debit cards to be swiped. The use of a dynamic authenticated visual identification scheme may allow the user of a device, e.g., a standalone automatic teller machine, at a venue to verify whether the device is legitimate by comparing a security element displayed on a screen of the device to a venue display screen.

Further, the present invention is not limited to be implemented in RF systems. Generally, the present invention may be implemented for use using substantially any suitable fields-based system that includes a transmitter and a receiver. In one embodiment, an infrared system, such as one implemented in a substantially closed venue which limits the travel of infrared waves, may be used to transmit security indicators to identification tags that use infrared technology.

Dynamic authentication is not limited to involving visual identification. That is, modalities other than vision may be explored when implementing dynamic authentication. In one embodiment, authentication may involve audio cues. A venue may broadcast music or a particular musical motif, and a representation of the music or musical motif may be displayed on an RFID tag worn by an individual who is to be authenticated. For example, the venue may broadcast a song such as the "Star Spangled Banner," and an RFID tag may display either the words "Star Spangled Banner," or may display a flag icon. In lieu of audio cues, scented cues may instead be provided. For instance, the venue may be permeated by the scent of flowers, and an RFID tag that is legitimate may display a flower as an overlay on a digital photograph of the wearer of the RFID tag. Alternatively, a display screen of a venue may display a flower, and an RFID tag may be scented with a floral scent.

While a transmitter that is a part of a security arrangement is typically configured to transmit a security element to an RFID tag on an RF channel, the transmitter may not necessarily transmit a security element to a display apparatus on an RF channel. For instance, a transmitter such as transmitter 116 of FIG. 1A may transmit a representation of an encrypted security element to an RFID on an RF channel while also transmitting another representation of the encrypted security element to a display apparatus on either a wireless communication link or a wired communications link.

The steps associated with the methods of the present invention may vary widely. Steps may be added, removed, altered, combined, and reordered without departing from the spirit or the scope of the present invention. By way of example, although a security arrangement has been described as sending an encrypted security identifier to an RF receiver when the RF receiver is detected within a vicinity of the security arrangement, the security arrangement may instead effectively broadcast an encrypted security identifier that is substantially automatically received by all RF receivers in a vicinity. In other words, a security arrangement may not specifically identify RF receivers in a vicinity but may, instead, essentially generically broadcast information that may be received by substantially all RF receivers that are enabled to receive encrypted security identifiers. Therefore, the present examples are to be considered as illustrative and not restrictive, and the invention is not to be limited to the details given herein, but may be modified within the scope of the appended claims.

What is claimed is:

1. An apparatus comprising:
a locator, the locator being arranged to determine when a radio frequency (RF) receiver is present within a vicinity;
a server, the server configured to identify a security element, the server further configured to obtain an information element associated with the RF receiver when the RF receiver is present within the vicinity; and
a transmitter, the transmitter configured to transmit a first representation of the security element to a display arrangement, the transmitter further configured to transmit a second representation of the security element to the RF receiver and to transmit the information element to the RF receiver, wherein the second representation of the security element is arranged to overlay the information element when the second representation of the security element and the information element are displayed.

2. The apparatus of claim 1 further including:
a database arranged to store the information element, wherein the server is configured to obtain the information element by searching the database.

3. The apparatus of claim 1 wherein the first representation of the security element and the second representation of the security element are the same.

4. The apparatus of claim 1 wherein the first representation of the security element is associated with a series, and the second representation is an offset representation of the series.

5. The apparatus of claim 1 wherein the security element is one selected from the group including a color, a series of colors, a pattern, and an icon.

6. The apparatus of claim 1 wherein the server is arranged to encrypt the first representation of the security element and to encrypt the second representation of the security element for transmission by the transmitter.

7. The transmitter of claim 1 wherein the transmitter includes an RF transmitter.

8. The apparatus of claim 1 wherein the information element is a photograph and the second representation of the security element is a color.

9. The apparatus of claim 1 wherein the security element is a series of colors including a first color and a second color, the second representation being a representation of the series of colors and the first representation being an offset representation of the series, and wherein the second representation is arranged to change from the first color to the second color before the first representation is arranged to change from the first color to the second color.

10. The apparatus of claim 1 wherein the first representation of the security element includes a first icon that represents the security element and the second representation of the security element includes a second icon that represents the security element, the first icon and the second icon being different but correlated.

11. An apparatus comprising:
means for determining when a receiver is present within a vicinity;
means for identifying a security element;
means for obtaining an information element associated with the receiver when the receiver is present within the vicinity;
means for transmitting a first representation of the security element to a display arrangement;
means for transmitting a second representation of the security element to the receiver; and
means for transmitting the information element to the receiver, wherein the second representation of the security element is arranged to overlay the information element when the second representation of the security element and the information element are displayed.

12. A method comprising:
determining if a radio frequency identification (RFID) element is present within a vicinity;
identifying a security element associated with an RFID element receiver if it is determined that the RFID element is present within the vicinity, wherein the security element is arranged to enable the RFID element to be authenticated;
identifying an information element associated with the RFID element if it is determined that the RFID element is present within the vicinity;
transmitting a first manifestation of the security element to a first arrangement;
transmitting a second manifestation of the security element to the RFID element; and
transmitting the information element to the RFID element, wherein the second manifestation of the security element is arranged to overlay the information element when the information element is displayed on the RFID element.

13. The method of claim 12 wherein the first manifestation and the second manifestation are the same.

14. The method of claim 12 wherein the second manifestation is associated with a series and the first manifestation is an offset representation of the series.

15. The method of claim 14 wherein the series is at least one selected from the group including a series of colors and a series of patterns.

16. The method of claim 12 further including:
encrypting the first manifestation for transmission; and
encrypting the second manifestation for transmission.

17. The method of claim 12 wherein the first arrangement includes a display screen, the method further including:
causing the first manifestation to be displayed on the display screen; and
causing the information element to be displayed on the RFID element with the second manifestation overlaid on the information element.

18. The method of claim 17 wherein the information element is a digital photograph.

19. Logic encoded in one or more tangible media for execution and when executed operable to:
determine if a radio frequency identification (RFID) element is present within a vicinity;
identify a security element associated with an RFID element receiver if it is determined that the RFID element is present within the vicinity, wherein the security element is arranged to enable the RFID element to be authenticated;
identify an information element associated with the RFID element if it is determined that the RFID element is present within the vicinity;
transmit a first manifestation of the security element to a first arrangement;
transmit a second manifestation of the security element to the RFID element; and
transmit the information element to the RFID element, wherein the second manifestation of the security element is arranged to overlay the information element when the information element is displayed on the RFID element.

20. The logic of claim 19 wherein the second manifestation is associated with a series and the first manifestation is an offset representation of the series.

21. The logic of claim 19 further operable to:
encrypt the first manifestation for transmission; and
encrypt the second manifestation for transmission.

22. The logic of claim 19 wherein the first arrangement includes a display screen, the logic further operable to:
cause the first manifestation to be displayed on the display screen; and
cause the information element to be displayed on the RFID element with the second manifestation overlaid on the information element.

23. The logic of claim 22 wherein the information element is a digital photograph.

24. An apparatus comprising:
a receiver, the receiver being arranged to obtain a signal that contains information associated with a first component and information associated with a changeable overlay; and
a display, the display configured to display the first component, the display further being configured to display the changeable overlay over the first component.

25. The apparatus of claim 24 wherein the receiver is a radio frequency (RF) receiver and the signal is an RF signal.

26. The apparatus of claim 25 wherein the apparatus is an RF identification (RFID) tag.

27. The apparatus of claim 24 wherein the changeable overlay is at least one selected from the group including a series of colors, a series of patterns, and a series of icons.

28. The apparatus of claim 24 wherein the signal is encrypted, and the apparatus further includes a decryption element configured to decrypt the signal to extract the first component and the changeable overlay.

29. The apparatus of claim 24 wherein the first component is a digital photograph.

30. The apparatus of claim 24 further including a locator device.

31. The apparatus of claim 30 wherein the locator device is a global positioning system (GPS) transmitter.

* * * * *